United States Patent [19]

Heimbigner

[11] Patent Number: 4,703,205

[45] Date of Patent: Oct. 27, 1987

[54] UNCOMPENSATED AND COMPENSATED GALLIUM ARSENIDE INPUT RECEIVERS

[75] Inventor: Gary L. Heimbigner, Anaheim, Calif.

[73] Assignee: Rockwell International Corporation, El Segundo, Calif.

[21] Appl. No.: 759,193

[22] Filed: Jul. 26, 1985

[51] Int. Cl.[4] .................... H03K 19/094; H03K 17/30
[52] U.S. Cl. ..................... 307/450; 307/448; 307/475; 307/363; 307/297
[58] Field of Search ............. 307/200 B, 443, 448, 307/450, 475, 354, 362–363, 558, 560, 564, 570, 573, 264, 297

[56] References Cited

U.S. PATENT DOCUMENTS

| | | | |
|---|---|---|---|
| 4,393,315 | 7/1983 | Stickel et al. | 307/475 X |
| 4,404,480 | 9/1983 | Ransom et al. | 307/450 X |
| 4,418,291 | 11/1983 | Watson, Jr. | 307/443 |
| 4,450,369 | 5/1984 | Schuermeyer | 307/450 |
| 4,494,016 | 1/1985 | Ransom et al. | 307/443 X |
| 4,590,393 | 5/1986 | Ransom et al. | 307/448 X |

FOREIGN PATENT DOCUMENTS 0042777 12/1981 European Pat. Off. ............. 307/450

Primary Examiner—Stanley D. Miller
Assistant Examiner—D. R. Hudspeth
Attorney, Agent, or Firm—H. Fredrick Hamann; George A. Montanye; Wilfred G. Caldwell

[57] ABSTRACT

A gallium arsenide input receiver and method modify a conventional voltage level shifter circuit at its input to adapt it to operate on the lower gallium arsenide input voltages. A gallium arsenide depletion common gate amplifier FET receives the lower range of input voltages and turns off when the input signal equals or overcomes its $V_p$ voltage. This causes a pull-up device to apply the full voltage supply to the input of the voltage level shifter circuit, thereby enhancing the input signal voltage level to that originally used for the level shifter circuit. In a second embodiment of voltage compensation circuit is added to compensate for process variations in the $V_p$ voltage for the common gate amplifier FET. Reference voltage is developed by a circuit including a compensating depletion FET having a $V_p$ similar to that of the common gate FET which compensates for changes in the common gate $V_p$ caused by process and temperature variations such that for all receivers on a chip the input signal will optionally see an input $V_p$ of approximately 1$^v$.

6 Claims, 3 Drawing Figures

U.S. Patent     Oct. 27, 1987     4,703,205
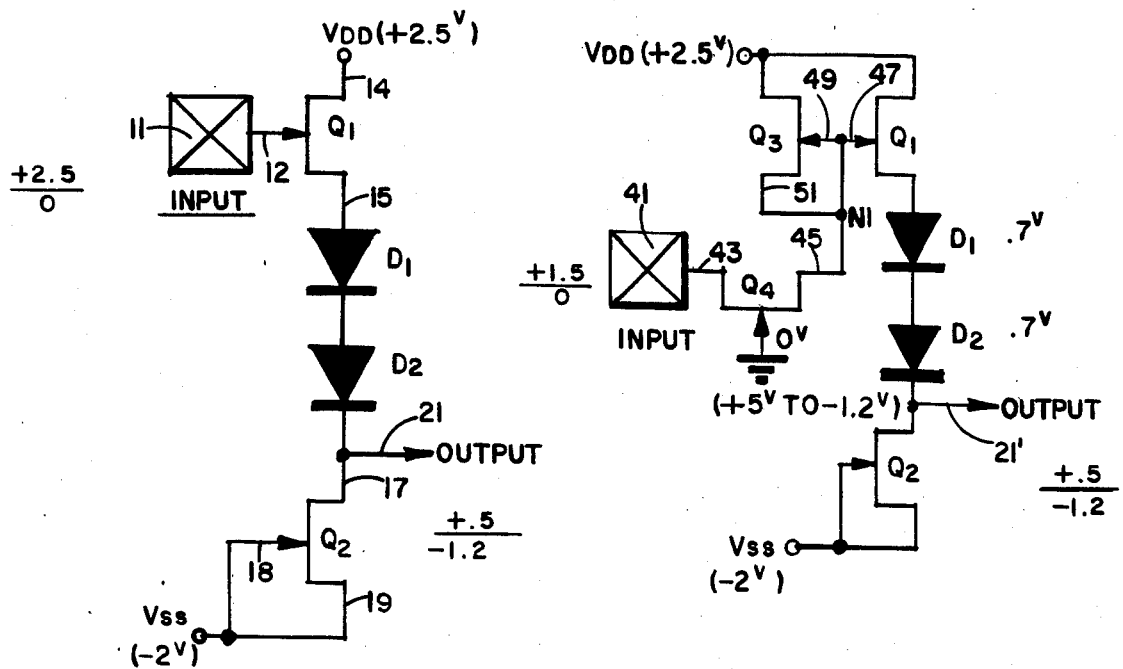
FIG. 1 PRIOR ART
FIG. 2
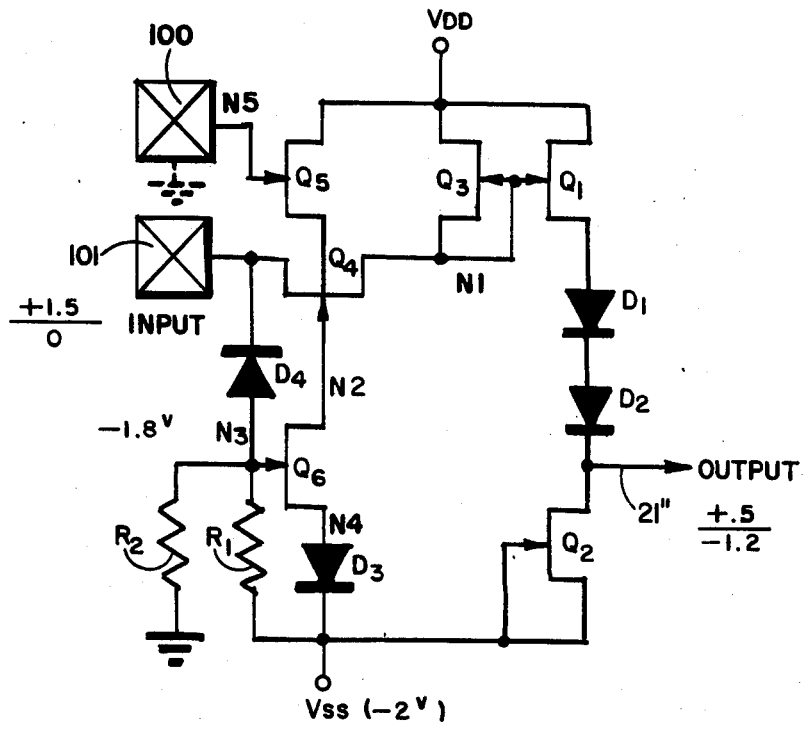
FIG. 3

UNCOMPENSATED AND COMPENSATED GALLIUM ARSENIDE INPUT RECEIVERS

This invention was made with Government support under Contract No. DASG60-82-C-0051 awarded by the Army. The Government has certain rights in this invention.

BACKGROUND OF THE INVENTION

1. Field of the Invention

The invention is an input receiver method and apparatus for changing input signal voltage levels to voltage levels in a range suitable for use in a conventional voltage level shifter circuit for all gallium arsenide circuitry.

2. Description of Prior Art

The only prior art known utilizes differential amplifier principles with all attendant disadvantages thereto and thus, is not really pertinent to the present invention which does not rely on differentials.

SUMMARY OF THE INVENTION

An uncompensated method and apparatus utilizes a conventional voltage level shifter circuit to provide output voltages in the gallium arsenide range, e.g., approximately +0.5 volts to −1.2 volts from an input range of $0^v$ to $2.5^v$. A unique input common gate amplifier depletion FET having a predetermined pinch-off voltage ($V_p$) is used such that when $V_p$ is exceeded by the input signal, the common gate amplifier is turned off to elevate the gate potential applied to a follower depletion FET in the voltage level shifter circuit to approximately the positive voltage source thereby producing output voltage levels in the gallium arsenide range. A compensated arrangement incorporates a voltage reference circuit which compensates for changes in the $V_p$ of the common gate amplifier as the result of temperature and fabrication tolerances.

BRIEF DESCRIPTION OF THE DRAWINGS

FIG. 1 is a conventional voltage level shifter circuit;

FIG. 2 is an uncompensated gallium arsenide circuit receiver in accordance with the principles of the present invention; and FIG. 3 is a compensated gallium arsenide receiver operating in accordance with the principles of the present invention.

DESCRIPTION OF THE PREFERRED EMBODIMENT

In the PRIOR ART showing of FIG. 1, a conventional voltage level circuit comprises the input pad 11 connected over lead 12 to the gate of transistor $Q_1$ having its drain 14 connected to a voltage supply $V_{DD}$ (usually +2.5 volts) and its source 15 connected to level shifting diodes $D_1$ and $D_2$ with diode $D_2$ connected to the drain 17 of transistor $Q_2$ which has its gate 18 connected back to its source 19 in turn connected to the other voltage source of supply ($V_{SS}$) usually −2 volts. The output connection 21 makes available the 0 to 2.5 volt input signal shifted down to the range +0.5 to −1.2 volts.

The problem with this circuit is the fact that it requires a high voltage range input signal to develop any kind of reliable gallium arsenide output signal level suitable for gallium arsenide logic gates. While it may marginally work for gallium arsenide input signal levels, it works best with input levels of 0 to +2.5 volts but the gallium arsenide outputs (which feed other inputs) usually don't exceed approximately 1.7 volts which is a different voltage range. ECL outputs have an even lower signal swing of approximately 0.8 volts, and thus, at best, this circuit provides marginal performance.

In FIG. 2, the uncompensated approach in accordance with this invention is shown wherein all components are produced in gallium arsenide circuitry, the transistors being depletion mode MESFETs, usually on a common chip.

First, it may be seen in FIG. 2 that the circuit between $V_{DD}$ and $V_{SS}$, on the right hand side, is identical to the prior art voltage level shifter of FIG. 1.

For FIG. 2, the input signal is shown coming from pad 41 to common input amplifier depletion FET $Q_4$ by way of its source 43, its drain 45 being tied to gates 47 and 49 for pull-up depletion FET $Q_3$ and follower depletion FET $Q_1$ and to the source of $Q_3$. Note that node N1 appears between $Q_4$ drain 45 and $Q_3$ source 51. Also, the gate for $Q_4$ is grounded or held at a fixed potential equivalent to zero volts for the example herein presented.

The object is to employ an input signal in the range 0 to +1.5 volts and produce an output at lead 21' of −1.2 volts to +0.5 volts for gallium arsenide circuits.

In operation, assume the $V_p$ characteristic for transistor $Q_4$ is approximately −1 volt and this transistor cuts off for inputs exceeding +1 volt and $Q_3$ then pulls node N1 up to about +2.5 volts ($V_{DD}$). This, in turn, supplies the full 2.5 volt signal to $Q_1$ of the voltage level shifter circuit.

The channel of $Q_4$ is 4 to 5 times wider than the channel of $Q_3$ so for an input of 0 volts, node N1 will be about +0.2 volts, which is desirable.

The circuit of FIG. 2 finds many applications but it is not compensated for $V_p$ variation in $Q_4$ due to fabrication tolerances or temperature changes.

The compensation arrangement of FIG. 3 is optimally useful on a chip where transistors $Q_4$ and $Q_6$ are made by the same process at the same time.

The circuit of FIG. 3 achieves compensation relatively inexpensively. The bias voltage for the gate of $Q_4$ at node N2 is nominally set at 0 volts. This corresponds to ground in FIG. 2. However, In FIG. 3 it is made to vary in a direction which compensates for $V_p$ variations in $Q_4$. This is accomplished by using diode $D_3$ in the source of the compensating depletion FET $Q_6$ which makes the source more positive than the gate—but results in overcompensation.

By adding resistors $R_1$ and $R_2$, this resulted in node N3 being about −1.85 volts and node N4 being about −1.3 volts, which eliminates the overcompensation.

The input signal caused node N2 to bounce around due to capacitance coupling through $Q_4$ to N2. This is remedied by including diode $D_4$, which acts as a capacitor, to couple the transitions of the input waveform to node N3, causing the opposite effect at node N2 as the capacitive coupling of $Q_4$ to node N2.

Resistors $R_1$ and $R_2$ provide about −1.8 volts at node N3, and are in the ratio of 1.8 units of resistance for $R_2$ relative to 0.2 units of resistance for $R_1$. These units of resistance may be multiplied by any reasonable factor desired and the resistors may be made as saturated resistors according to the processes outlined herein, although regular resistors will work.

Considering FIG. 3 in a greater detail now, it will be appreciated that the compensating voltage for the $V_p$ of Q4 should appear at node 2 in order that the input signal from pad 101 will swing about a proper trigger point of nominally +1 volts. Thus, Q6 causes node 2 to vary as its $V_p$ varies and it is assumed that Q4 and Q6 are located quite closely on a chip and are subject to the same fabrication tolerances and temperatures for precise compensation. This results in Q4 and Q6 having generally similar $V_p$'s.

The reference voltage applied to N2 should be 0 for $V_p = -1$ volt nominal. The reference voltage will be $-0.2$ for $V_p = -1.2$ volts, and the reference voltage will be $+0.2$ volts for $V_p = -0.8$ volts. Thus, the difference between 0 and $-1$ is 1. The difference between $-0.2$ and $-1.2$ is still 1, and the difference between $+0.2$ and $-0.8$ is still 1, with the object being that the incoming signal swing sees the same triggering point (i.e.) $+1$ volt such that when the input signal exceeds this value, node N1 is raised to substantially $V_{DD}$ volts.

The diode D3 serves to magnify variations of the $V_p$ of Q6. For example, if Q6 were connected directly to $V_{SS}$ ($-2$ volts) then the $V_p$ of the device furnishes its own built-in drive, but by using the diode and the resistor dividers, the circuit is able to subtract about 0.5 volts from the nominal 1 volt so 0.5 volt plus or minus 0.2 volt is a much larger percentage than 1 volt plus or minus 0.2 volt. The D3 drop is 0.7 or 0.8 volts; therefore with N3 at $-1.8$ volts, N4 at $-1.3$ volts, and $V_p = -1$ volt, the effective drive on Q6 is 0.5 volts.

The reverse biased diode D4 is located between the input and node N3 and provides a capacitive coupling to couple a small portion of the input to the Q6 gate oppositely to the input coupled to node N2 to compensate therefor. Otherwise, the later capacitive coupling would slow or disturb the response of the circuit.

For purposes of shifting of the ranges to permit ECL and TTL voltages to be placed in a gallium arsenide input voltage ranges, node N5 at pad 100 (common to all receivers on a chip) can be used to shift node N2 to suit the receivers to any of the ranges for gallium arsenide, ECL and TTL relative to input signal swing. In other words, this insures that the swing is about the nominal voltage $V_p$ of common amplifier Q4 to properly provide the desired range of outputs on output lead 21".

The receiver of this invention is non-inverting, without excessive signal delay or polarity change and the compensating embodiment is polarity sensitive in offsetting the effects of fabrication tolerances and temperature on the $V_p$ of the common amplifier FET.

A process suitable for manufacturing the gallium arsenide circuit of this invention is set forth in *IEEE Transactions on Electron Devices*, Vol. ED 27, No. 6, June 1980 at pages 1116-1124. The saturated resistors are further described in *IEEE Transactions On Microwave Theory and Techniques*, Vol. MTT 30, No. 7, July 1982, pages 1007-1013.

What is claimed is:

1. An input receiver for gallium arsenide circuits, comprising in combination:
   a voltage level shifter circuit for connection between sources of supply voltage comprising a depletion FET follower device having a gate, level shifting diodes and a pull down depletion FET, all of the depletion FET follower device, diodes and pull down depletion FET connected in series, with an output connection between the diodes and the pull down FET;
   a common gate amplifier depletion FET for receiving an output signal on its source;
   said amplifier FET having a gate held at a fixed potential between the supply voltages, and having a drain;
   a pull up device connected between the drain of the amplifier FET and one of said voltage sources whereby when the input signal voltage level rises about the fixed voltage to cut off the amplifier FET, the voltage at the drain of said amplifier FET rises to almost that of said one source; and,
   a connection from the amplifier FET drain to the gate of the follower depletion FET to increase the voltage level shifter output voltage.

2. An input receiver for gallium arsenide circuits, comprising in combination:
   a voltage level shifter circuit for connection between sources of supply voltage comprising a depletion FET follower device having a gate, level shifting diodes and a pull down depletion FET, all of the depletion FET follower device, diodes and pull down depletion FET connected in series, with an output connection between the diodes and the pull down FET; and,
   means, including a common gate amplifier FET, connected to the gate of said depletion FET follower device, for receiving an input signal and increasing its magnitude to substantially the value of one of said sources at a predetermined input signal voltage level and applying it to the gate of the follower device to increase the voltage level shifter output voltage.

3. A compensated input receiver for gallium arsenide circuits in accordance with claim 2, comprising in combination:
   said common gate means comprising a common gate amplifier depletion FET having a predetermined $V_p$ (pinch-off voltage) characteristic and having a gate, source and; and,
   compensating means connected to the gate of the common gate amplifier FET for adding or subtracting a voltage to or from said $V_p$ voltage to cause it to present a nominal predetermined value to any incoming signal applied to the source of said common amplifier FET.

4. A method of using a conventional voltage level shifter circuit to accept input signals in a non-gallium arsenide range and output corresponding signals in a downshifted gallium arsenide range comprising the steps of:
   applying input signals to an input circuit connected to the input of the voltage level shifter circuit; and,
   enhancing the input signal voltage level to the level of signals usually received by the voltage level shifter circuit at a predetermined voltage level thereof by raising the signal level at said predetermined level to the voltage supply level for the voltage level shifter circuit; and,
   compensating for changes in said predetermined voltage level.

5. A gallium arsenide signal input receiver, comprising in combination:
   a voltage level shifter circuit comprising series connected depletion follower FET having a source and drain, level shifting diodes and a depletion pull-down FET having a source and drain, the combination connected between an approximately $+2.5$ volt supply source on the depletion follower FET drain and approximately $-2$ volt supply source on the pull-down FET source with an output connection connected to the drain of the pull-down FET;

a depletion common gate amplifier FET having a gate, source and drain and a depletion pull-up FET device having a gate and drain and said last mentioned two FETs being connected in series, the former having its source as a receiver input connection for input signals and the latter having its drain connected to the +2.5 volt supply source, the gate of the amplifier FET being connected to a fixed potential source having a potential between the values of said sources;

a connection from the drain of the amplifier FET to the gates of the pull-up FET and the follower FET whereby when the input signal equals or exceeds the $V_p$ (pinch-off voltage) of the amplifier FET, it is turned off and the pull-up FET applies approximately +2.5 volts to the gate of the follower FET.

6. The receiver of claim 5, further comprising:

polarity sensitive means connected between the amplifier gate and its fixed potential source and responsive to the input signal and said −2 volt source to compensate the $V_p$ of the amplifier FET by adding thereto or subtracting therefrom an amount to maintain the effective $V_p$ presented to input signals at a predetermined nominal value.

* * * * *